US005629220A

United States Patent [19]
Yang

[11] Patent Number: 5,629,220
[45] Date of Patent: May 13, 1997

[54] METHOD OF MANUFACTURE OF PULL DOWN TRANSISTOR WITH DRAIN OFF-SET FOR LOW LEAKAGE SRAM'S

[75] Inventor: Ming-Tzong Yang, Hsin Chu, Taiwan

[73] Assignee: United Microelectronics Corporation, Hsin-Chu, Taiwan

[21] Appl. No.: 503,420

[22] Filed: Jul. 17, 1995

Related U.S. Application Data

[62] Division of Ser. No. 97,037, Jul. 27, 1993, abandoned.

[51] Int. Cl.$^6$ .................................................. H01L 21/265
[52] U.S. Cl. ........................... 438/286; 438/305; 438/238
[58] Field of Search ................................ 437/44, 41 RLD, 437/40 AS, 41 AS, 41 RMM

[56] References Cited

U.S. PATENT DOCUMENTS

| | | | |
|---|---|---|---|
| 4,318,216 | 3/1982 | Hsu | 437/44 |
| 4,795,719 | 1/1989 | Eitan | 437/44 |
| 4,837,173 | 6/1989 | Alvis et al. | 437/44 |
| 5,091,763 | 2/1992 | Sanchez | 437/41 RLD |
| 5,210,044 | 5/1993 | Yoshikawa | 437/44 |
| 5,268,318 | 12/1993 | Harari | 437/49 |

FOREIGN PATENT DOCUMENTS

| | | | |
|---|---|---|---|
| 0040374 | 2/1988 | Japan | 437/44 |

OTHER PUBLICATIONS

"A Polysilicon Transistor Technology for Large Capacity SRAMs" by Ikeda et al, IEDM, 1990, pp. 469–472.

"A 23-ns 4-Mb CMOS SRAM with 0.2-μA stand by Current", IEEE Journal of Solid-State Circuits, vol. 25, No. 5, Oct. 1990, pp. 1075–1080, by Sasaki et al.

"A 5.9μm$^2$ Super Low Power SRAM Cell Using a New Phase-Shift Lithography" by Yamanaka et al, IEDM, 1990, pp. 477–480.

*Primary Examiner*—Trung Dang
*Attorney, Agent, or Firm*—William H. Wright

[57] ABSTRACT

The pull down transistor of a static SRAM semiconductor device is formed with oxide and polysilicon regions formed on a doped silicon substrate. A masking area is formed over the drain side of the polysilicon and the areas of the drain region proximal to the gate structure in the silicon and oxide layers below. N+ dopant is implanted into the unmasked areas of said substrate about the polysilicon region with the drain doping offset by the resist overlying the proximal portion of the drain region. A spacer is formed by chemical vapor deposition about the polysilicon region. Next an N-implantation follows with the offset provided by the spacers about the polysilicon region.

10 Claims, 2 Drawing Sheets

METHOD OF MANUFACTURE OF PULL DOWN TRANSISTOR WITH DRAIN OFF-SET FOR LOW LEAKAGE SRAM'S

This application is a division of U.S. patent application Ser. No. 08/097,037; filed Jul. 27, 1993, now abandoned.

BACKGROUND OF THE INVENTION

1. Field of the Invention

This invention relates to transistor devices and more particularly to pull-down transistor structures.

2. Description of Related Art

There is a problem of leakage in the drains of pull down transistors in SRAM circuits. There is no drain offset so there is drain induced lowering of barrier potential $\phi_B$ and band-to-band tunnelling for the pull down transistor limits performance. In particular, a large leakage current is caused in a low power Static Random Access Memory (SRAM) cell, especially in cases in which the thickness of the gate is very thin, (that is $\leq$ about 150Å) Since an SRAM is designed to retain stored data indefinitely, this is a problem since the leakage will reduce the length of time during which the data can be stored. As the poly resistor and pull down transistor are connected in series, if the pull down leakage current is large relative to the poly resistor, the storage node cannot pull high, so data is lost. If we simply push the poly resistor high (poly resistor resistance is low) then the SRAM cannot operate with low power. Thus, the best solution is to reduce the leakage current of the pull down transistor.

SUMMARY OF THE INVENTION

In accordance with this invention a process forms a pull down transistor of an SRAM semiconductor device. The device and the method of fabrication thereof comprise a) forming a gate structure on a semiconductor substrate of a first conductivity type;

b) forming a mask in an area on the drain side of the polysilicon structure, leaving the remainder of the gate structure as well as the periphery of the substrate unmasked, c) implanting a first dopant into the unmasked areas of the substrate about the gate structure to form source and drain regions with the drain region offset away from the gate structure by the mask, d) forming a spacer about the gate structure, first by chemical vapor deposition of a spacer material and then by employing a subtractive process to remove the spacer material from the surface of polysilicon structure except immediately about the periphery of the polysilicon region, and e) implantation of a second dopant into the outer portion of the source and the drain regions surrounding the spacer.

Preferably the first dopant is N+ and the second dopant is N−.

It is further preferred that the first dopant is an N+ dopant of arsenic (As) implanted at between about 40 key and about 100 keV, with a concentration of between about 5×E14cm$^{-2}$ and about 5×E16cm$^{-2}$.

It is preferred that the second dopant is ion implanted into the outer portion of the source and the drain regions where the spacer does not provide a shield.

It is further preferred that the chemical species of the second dopant is phosphorous (P), implanted at an energy of between about 40 keV and about 80 keV, with a concentration of between about 5×E12cm$^{-2}$ and about 5×E14cm$^{-2}$.

Preferably, a silicon oxide spacer is formed before implantation of the second dopant.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
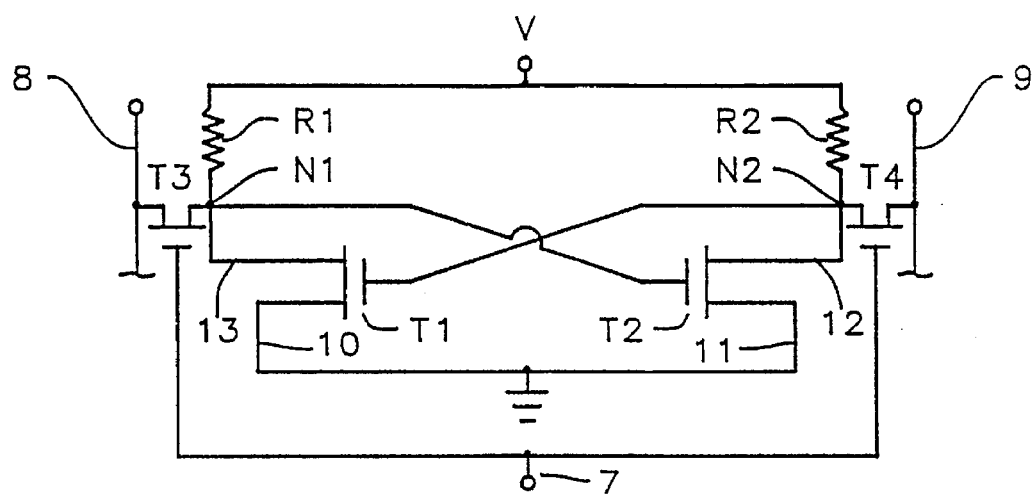
FIG. 1 shows a typical SRAM circuit with a pull down transistor.

FIG. 1 shows a typical prior art SRAM latch circuit with a group of four transistors T1, T2, T3, and T4 with the gates of the transistors T1 and T2 connected in series with the source-drain circuits of transistors T3 and T4 via nodes N2 and N1 respectively. The source drain circuits of transistors T3 and T4 are connected between bitlines 8 and 9 and nodes N1 and N2 respectively. The gates of transistors T3 and T4 are connected to wordline 7. The source and drain of transistor T1 are connected via lines 13 and 10 between node N1 and ground and, as stated above, the gate of transistor T1 is connected to node N2. The source and drain of transistor T2 are connected via lines 12 and 11 between node N2 and ground and, as stated above, the gate of transistor T2 is connected to node N1. Voltage V is connected to resistors R1 and R2 which are connected respectively at their opposite ends to node N1 and node N2. For example, if the wordline 7 is high and T3 and T4 are turned on, the bit line 8 is high and the bitline 9 is low, then T2 is turned on and T1 is turned off. Node N2 is low and node N1 is high. Then, when the wordline 7 is low, T3 and T4 turn off, because node N1 is high and node N2 is low so the remaining pull down transistor T2 is turned on, and T1 is turned off.

Figure 2:
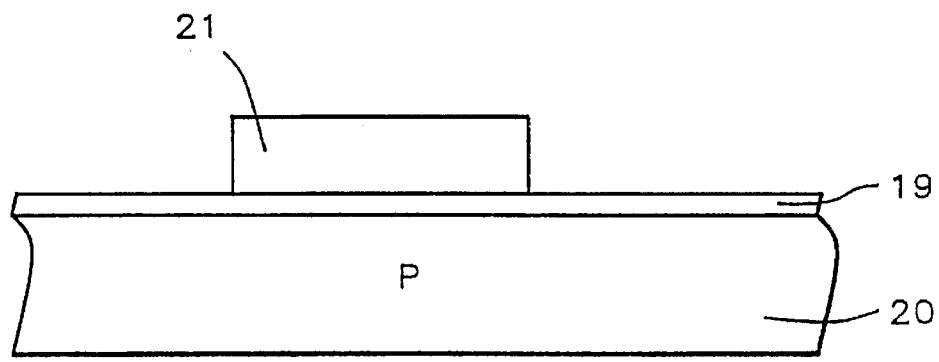
FIGS. 2–6 show a device as it is being formed by means of the process of this invention.

Referring to FIG. 2, the first stage of the process of manufacture of a MOSFET transistor device adapted for use in an SRAM in accordance with this invention is illustrated. A semiconductor substrate 20 of P– type silicon doped with boron by implanting at an energy level between about 30 keV and about 300 keV, with a concentration of between about 1E12 cm$^{-3}$ and about 1E14cm$^{-3}$. Alternatively, the substrate can be composed of an N– type material and a P well can be formed in the substrate for an N– type device to be made subsequently.

The gate oxide layer 19 composed of SiO$_2$ (which can be grown by passing an oxygen rich gas over the surface of the substrate 20 at a temperature between about 800° C. to about 950° C.) covers the surface of semiconductor substrate 20. To form gate oxide layer 19, an initial stage is to form a LOCOS (Local Oxidation of Silicon) field oxide in accordance with the state of the art. The thickness of gate oxide layer 19 is between about 80Å thick and about 300Å thick.

A polystlicon gate structure 21 is formed on top of gate oxide layer 19. Gate structure 21 comprises a heavily doped layer of polysilicon which can be formed by thermal decomposition of silane SiH$_4$ in a reactor between about 575° C. and 650° C. at between about 0.2 Torr and about 1.0 Torr using 100% silane or a diluted mixture of 20–30% silane in nitrogen at about the same pressure, as described in Sze, VLSI Technology, McGraw Hill Book Company pages 238–239 (1988).

Figure 3:
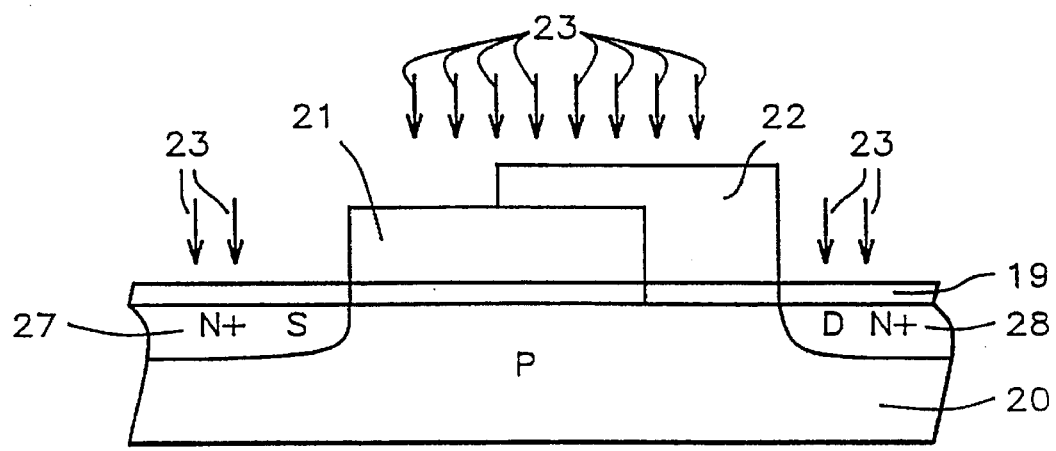

In FIG. 3 the formation of a mask area on the drain side of the polysilicon and implantation of the source region 27 and drain region 28 of the transistor device of FIG. 2 are illustrated. First, a photoresist mask 22 is formed above a portion of at the right side of gate structure 21 extending, as well, over part of the surface of the gate oxide layer 19 and substrate 20 to mask them. Next N+ ions 23 are implanted into the source region 27 and the drain region 28. Drain region 28 is offset to the right from the polysilicon gate structure 21 by the photoresist 22 which covers the part of the substrate 20, just to the right of gate structure 21. The chemical species of the dopant implanted is arsenic (As) with a dose of between about $5E14 cm^{-2}$ and about $5E16 cm^{-2}$, and formed by energy of between about 40 keV and about 100 keV in a tool such as a high current implanter. At the end of the ion implantation, the resist is removed by means of a process such as a plasma $O_2$ resist strip and an $H_2O_2/H_2SO_4$ resist removal.

Figure 4:
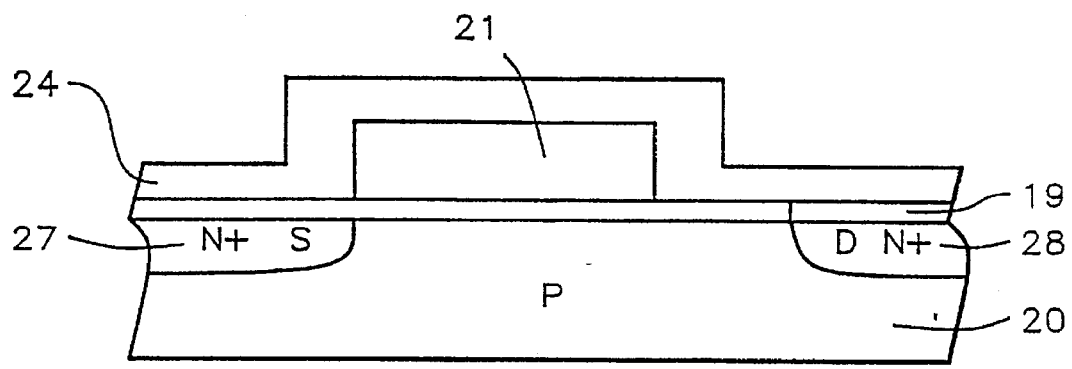

In FIG. 4, on top of the device of FIG. 3, a deposit 24 composed of $SiO_2$ is formed coating the gate structure 21 and the exposed surface of the gate oxide 19. The deposit 24 is deposited in a process reactor to a thickness of between about 1kÅ and about 4kÅ by CVD (Chemical Vapor Deposition.) Alternatively, the CVD $SiO_2$ can be formed by APCVD (Atmospheric Pressure CVD) or PECVD (Plasma Enhanced CVD.)

Figure 5:
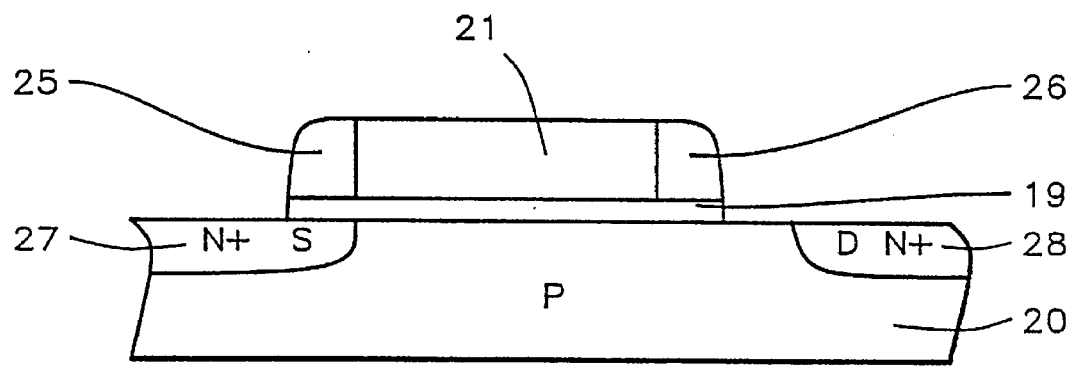

Then, as shown in FIG. 5, the CVD deposit 24 is etched forming the spacers 25 and 26 adjacent to the polysilicon gate. Except for the spacers 25 and 26, all of the CVD deposit 24 has been etched away, by an anisotropic etching process, removing most of the layer 24, but leaving the sidewall spacers 25 and 26 at the edge of the poly without using a mask. The CVD deposit 24 and the portions of the gate oxide 19 beneath the portions of layer 24 removed are both etched by RIE (reactive ion etching.) The gate oxide removed forms a gate oxide structure extending laterally as far as the spacers 24 and 25 from the gate structure 21.

Figure 6:
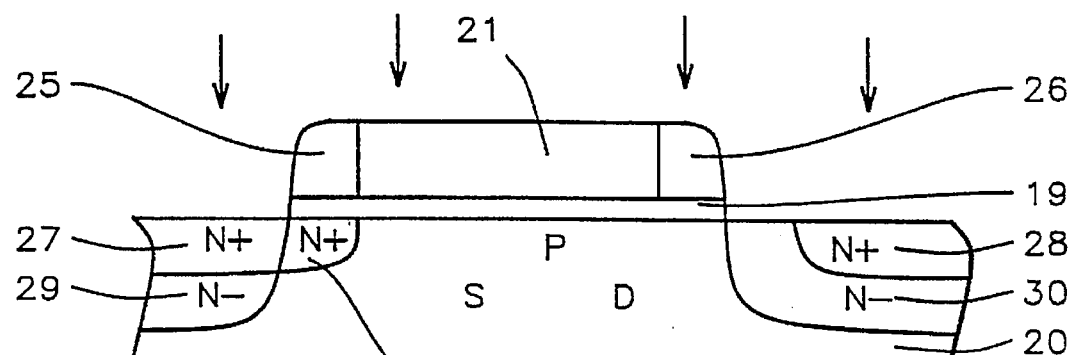

In FIG. 6, a second ion implant of N− ions is deposited into substrate 20 in the outer portion of source region 27 where the spacer 25 does not provide a shield. Thus, the region 29 below the region 27 to the left of spacer 25 is doped N−. The chemical species of the dopant implanted is phosphorous P11 with a dose of between about $5 \times E12 cm^{-2}$ and about $5 \times E14 cm^{-2}$, at an energy of between about 40 keV and about 80 keV in a medium current implanter tool. The region is already doped N+ so addition of N− dopant adds more N dopant to the N+ region 27.

In the drain region in the substrate 20, the N− implant is strong between the region 28 and the edge of the spacer 26, so that the N+ region 28 is separated from the gate structure 21 by the width of the spacer and the additional N− region 30 which extends to the left and below the N+ region 28 providing a drain off-set by the width of the region 30 at the surface of the substrate 20 and the edge of gate oxide structure 19.

Subsequently, $SiO_2$ is deposited by CVD for the purpose of forming the spacers 25 and 26. The $SiO_2$ is deposited to a thickness of between about 1000Å and about 4000Å by CVD (chemical vapor deposition.) The CVD $SiO_2$ can be an APCVD (Atmospheric Pressure CVD) or PECVD (Plasma Enhanced CVD.)

The reactant gases can be as follows:

$SiH_4$ and $O_2 \rightarrow SiO_2$ and $2H_2$ or

TEOS $Si(OC_2H_5)_4 \rightarrow SiO_2$ plus byproducts at a temperature between about 350° C. and about 450° C. or organic or organosilicon compounds at a temperature between about 600° C. and about 800° C.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A process of forming an asymmetric pull-down transistor within an SRAM, the process comprising
   a) forming a polysilicon gate structure on a semiconductor substrate of a first conductivity type;
   b) forming a mask in an area on the drain side of said polysilicon gate structure, leaving the remainder of said gate structure as well as a portion of said substrate unmasked,
   c) implanting a first N-type dopant into the unmasked areas of said substrate to form source and drain regions with an N+ doped region of said drain offset away from said gate structure by said mask and with an N+ doped region of said source aligned to the edge of said gate structure,
   d) forming insulating spacers proximate said gate structure,
   e) implanting a second dopant into the outer portion of said source region beyond said spacer and below said source region beyond said spacer and into and extending below said N+ doped region of said drain and between said N+ doped region of said drain and said spacer proximate thereto said second dopant being an N− dopant, thereby forming a pull down transistor coupled to other devices within an SRAM,
   whereby said SRAM is a low leakage SRAM device.

2. The process of claim 1 wherein said first dopant is N+ and said second dopant is N−.

3. The process of claim 2 wherein said first dopant is an N+ dopant of arsenic (As) implanted at between about 40 keV and about 100 keV, with a concentration of between about $5 \times E14 cm^{-2}$ and about $5 \times E16 cm^{-2}$.

4. The process of claim 1 wherein said second dopant is ion implanted into the outer portion of source and drain regions where said spacer does not provide a shield.

5. The process of claim 4 wherein said first dopant is N+ and said second dopant is N−.

6. The process of claim 5 wherein the chemical species of said second dopant is phosphorous (P), implanted at an energy of between about 40 keV and about 80 keV, with a concentration of between about $5 \times E12 cm^{-2}$ and about $5 \times E14 cm^{-2}$.

7. The process of claim 3 wherein said second dopant is ion implanted into the outer portion of source and drain regions where said spacer does not provide a shield.

8. The process of claim 7 wherein said second dopant is N−.

9. The process of claim 8 wherein the chemical species of said second dopant is phosphorous (P) implanted at an energy between about 40 keV and about 80 keV, with a concentration of between about $5 \times E12 cm^{-2}$ and about $5 \times E14 cm^{-2}$.

10. The process of claim 9 wherein a silicon oxide spacer is formed before implantation of said second dopant.

* * * * *